(12) United States Patent
DeCusatis et al.

(10) Patent No.: US 8,228,213 B2
(45) Date of Patent: Jul. 24, 2012

(54) DATA COMPRESSION SYSTEM AND ASSOCIATED METHODS

(75) Inventors: Casimer M. DeCusatis, Poughkeepsie, NY (US); Thomas A. Gregg, Highland, NY (US)

(73) Assignee: International Business Machines Corporation, Armonk, NC (US)

( * ) Notice: Subject to any disclaimer, the term of this patent is extended or adjusted under 35 U.S.C. 154(b) by 120 days.

(21) Appl. No.: 12/565,093

(22) Filed: Sep. 23, 2009

(65) Prior Publication Data
US 2011/0068957 A1 Mar. 24, 2011

(51) Int. Cl.
*H03M 7/38* (2006.01)

(52) U.S. Cl. ............... 341/51; 341/65; 341/67; 341/106; 341/107

(58) Field of Classification Search ............ 341/65, 341/67, 106, 107, 51
See application file for complete search history.

(56) References Cited

U.S. PATENT DOCUMENTS

| | | | |
|---|---|---|---|
| 6,615,373 B2 * | 9/2003 | Elko et al. ............... 714/47.3 |
| 6,700,512 B2 * | 3/2004 | Abdat ....................... 341/87 |
| 6,731,814 B2 * | 5/2004 | Zeck et al. ................ 382/239 |
| 6,879,271 B2 * | 4/2005 | Abdat ....................... 341/87 |
| 7,088,276 B1 | 8/2006 | Wegener .................. 341/155 |
| 7,129,860 B2 | 10/2006 | Alvarez .................... 341/51 |
| 7,272,320 B2 | 9/2007 | DeCusatis ................ 398/98 |
| 7,277,482 B2 | 10/2007 | Wreschner ............... 375/240 |
| 7,394,410 B1 | 7/2008 | Wegener .................. 341/61 |
| 7,400,274 B2 * | 7/2008 | Fallon et al. ............. 341/51 |
| 7,417,568 B2 * | 8/2008 | Fallon et al. ............. 341/51 |
| 7,561,081 B2 * | 7/2009 | Krimerman et al. ...... 341/106 |
| 7,764,202 B2 * | 7/2010 | Schneider ................ 341/51 |
| 7,777,651 B2 * | 8/2010 | Fallon et al. ............. 341/51 |
| 2002/0109615 A1 * | 8/2002 | Abdat ....................... 341/51 |
| 2003/0090397 A1 * | 5/2003 | Rasmussen ............... 341/51 |
| 2010/0079314 A1 * | 4/2010 | Gonion ..................... 341/67 |
| 2010/0127902 A1 * | 5/2010 | Schneider ................ 341/51 |
| 2010/0188273 A1 * | 7/2010 | He et al. .................. 341/87 |

* cited by examiner

*Primary Examiner* — Linh Nguyen
(74) *Attorney, Agent, or Firm* — Steven Chu; Ido Tuchman

(57) ABSTRACT

A system to compress an inter-system channel data stream may include a data compression application executing via a computer processor. The system may additionally include a transmit dictionary used by said data compression application to compress an inter-system channel data stream. The system may also include a data decompression application executing via a second computer processor to decompress the inter-system channel data stream. The system may further include a receive dictionary used by said data decompression application to decompress the inter-system channel data stream.

18 Claims, 7 Drawing Sheets

DATA COMPRESSION SYSTEM AND ASSOCIATED METHODS

BACKGROUND OF THE INVENTION

1. Field of the Invention

The invention relates to the field of computer systems, and, more particularly, to data compression in such.

2. Description of Background

Data compression in networks which transmit data between computer systems often involves transmitting data using an encoding scheme to reduce the amount of bandwidth and receiver buffer space necessary when compared to transmitting the same data not using the encoding scheme. Lossless data compression is typically an encoding scheme which can regenerate all of the original data. The Lempel-Ziv Stac ("LZS") algorithm is an example of a lossless data compression encoding scheme.

The LZS algorithm is a standard approach for achieving lossless data compression. This algorithm searches an incoming data stream for repeating data patterns by comparing the incoming data intended for transmission to a history buffer, or dictionary, maintained at the transmitter side of the link. Repetitive data patterns are replaced by a token of shorter length; this token usually consists of a pointer to the repetitive data's matching location in the history buffer and the length of the matching data sequence.

For example, the transmitter might maintain a history of the past 1 Kbyte of data frames, and whenever a new data sequence is input to the compressor, this history is searched for matching data sequences. Instead of transmitting the actual data, a token might be generated which effectively says "go back 150 bytes in the history and transmit the next 10 bytes". At the receive side of the link, a decompressor recreates an exact replica of the compressor's dictionary and uses the tokens provided by the data stream to invert the compression operation.

Thus the tokens can be viewed as pointers into the 1 Kbyte data history. The history files at both ends of the link should match, otherwise the decompressor pointer token will output meaningless data. Thus, future data is compressed based on the previous data history.

Typical compression ratios vary with the type of data and amount of redundancy present. Completely random data will not be compressed very much at all, while highly redundant traffic with a lot of idle characters may experience a very large improvement.

Data compression efficiency thus depends on the characteristics of the network communications protocol which is employed. In particular, this invention is concerned with an inter-system channel (ISC) link which is used to transmit data functions within a Parallel Sysplex computer architecture.

SUMMARY OF THE INVENTION

According to one embodiment of the invention, a system to compress an inter-system channel data stream may include a data compression application executing via a computer processor. The system may additionally include a transmit dictionary used by the data compression application to compress an inter-system channel data stream. The system may also include a data decompression application executing via a second computer processor to decompress the inter-system channel data stream. The system may further include a receive dictionary used by the data decompression application to decompress the inter-system channel data stream.

The data compression application may comprise a lossless data compression algorithm. The lossless data compression algorithm may comprise a Lempel-Ziv Stac algorithm. The data compression application may limit file sizes for the lossless data compression algorithm. The data compression application may pre-search for literal data in the inter-system channel data stream.

The literal data may include at least one of inter-system channel idles and inter-system channel continuous sequences. The data compression application may select start of frame characters, end of frame characters, and/or disparity control.

The transmit dictionary and/or the receive dictionary may be purged when a loss of signal condition and/or a loss of light condition is detected. The transmit dictionary and/or the receive dictionary may be restarted when the loss of signal condition and/or the loss of light condition is cleared. The data compression application and/or the data decompression application may recognize system time protocol time stamps in the inter-system channel data stream as literal data.

Another aspect of the invention is a method to compress an inter-system channel data stream. The method may include compressing an inter-system channel data stream via a data compression application executing via a computer processor and a transmit dictionary. The method may also include decompressing the inter-system channel data stream via a data decompression application executing via a second computer processor and a receive dictionary.

The method may further include limiting file sizes for a lossless data compression algorithm used by the data compression application. The method may additionally include pre-searching for literal data in the inter-system channel data stream via the data compression application.

The method may also include selecting start of frame characters, end of frame characters, and/or disparity control via the data compression application. The method may further include purging the transmit dictionary and/or the receive dictionary when a loss of signal condition and/or a loss of light condition is detected. The method may additionally include recognizing system time protocol time stamps in the inter-system channel data stream as literal data via the data compression application and/or the data decompression application.

Another aspect of the invention is a computer program product that may compress an inter-system channel data stream. The computer program product may be configured to compress an inter-system channel data stream via a data compression application executing via a computer processor and a transmit dictionary. The computer program product may also decompress the inter-system channel data stream via a data decompression application executing via a second computer processor and a receive dictionary.

DETAILED DESCRIPTION OF THE INVENTION

Figure 1:
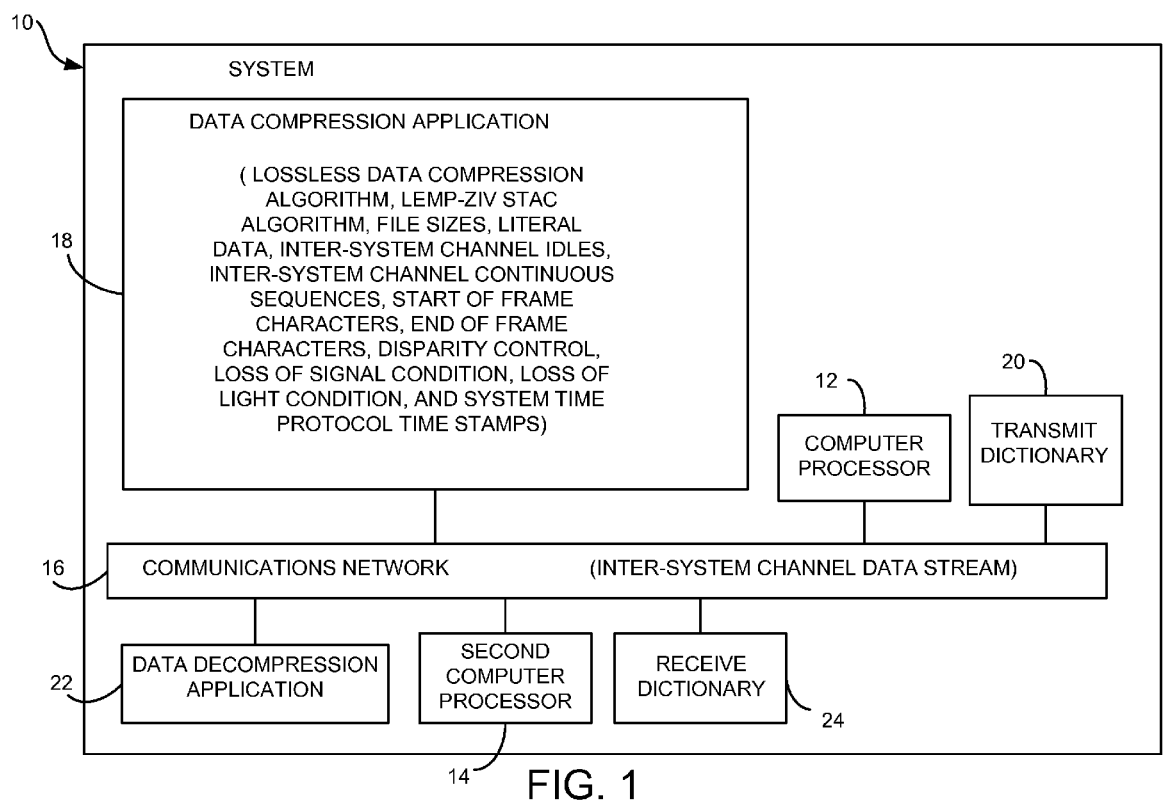
FIG. 1 is a schematic block diagram of a system to compress an inter-system channel data stream in accordance with the invention.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

With reference now to FIG. 1, a system 10 to compress an inter-system channel data stream is initially described. The system 10 is a programmable apparatus that stores and manipulates data according to an instruction set as will be appreciated by those of skill in the art.

In one embodiment, the system 10 includes a plurality of computer processors, e.g. computer processor 12 and second computer processor 14. In another embodiment, the system 10 includes a communications network 16, which enables a signal to travel anywhere within system 10 and/or to any other connected system. The communications network 16 is wired and/or wireless, for example. The communications network 16 is local and/or global with respect to system 10, for instance.

In one embodiment, the system 10 includes a data compression application 18 executing via the computer processor 12. In another embodiment, the system 10 additionally includes a transmit dictionary 20 used by the data compression application 18 to compress an inter-system channel data stream. In one embodiment, the inter-system channel data stream comprises inbound data, compressed data, and/or outbound data that matches the inbound data.

In one embodiment, the system 10 includes a data decompression application 22 executing via the second computer processor 14 to decompress the inter-system channel data stream. In another embodiment, the system 10 includes a receive dictionary 24 used by the data decompression application 22 to decompress the inter-system channel data stream.

In one embodiment, the data compression application 18 comprises a lossless data compression algorithm. In another embodiment, the lossless data compression algorithm comprises a Lempel-Ziv Stac algorithm.

In one embodiment, the data compression application 18 limits file sizes for the lossless data compression algorithm. In another embodiment, the data compression application 18 pre-searches for literal data in the inter-system channel data stream.

In one embodiment, the literal data includes at least one of inter-system channel idles and inter-system channel continuous sequences. In another embodiment, the data compression application 18 selects start of frame characters, end of frame characters, and/or disparity control.

In one embodiment, the transmit dictionary 20 and/or the receive dictionary 24 is purged when a loss of signal ("LOS") condition and/or a loss of light ("LOL") condition is detected. In another embodiment, the transmit dictionary 20 and/or the receive dictionary 24 is restarted when the loss of signal condition and/or the loss of light condition is cleared. In one embodiment, the data compression application 18 and/or the data decompression application 22 recognizes system time protocol time stamps in the inter-system channel data stream as literal data.

Figure 2:
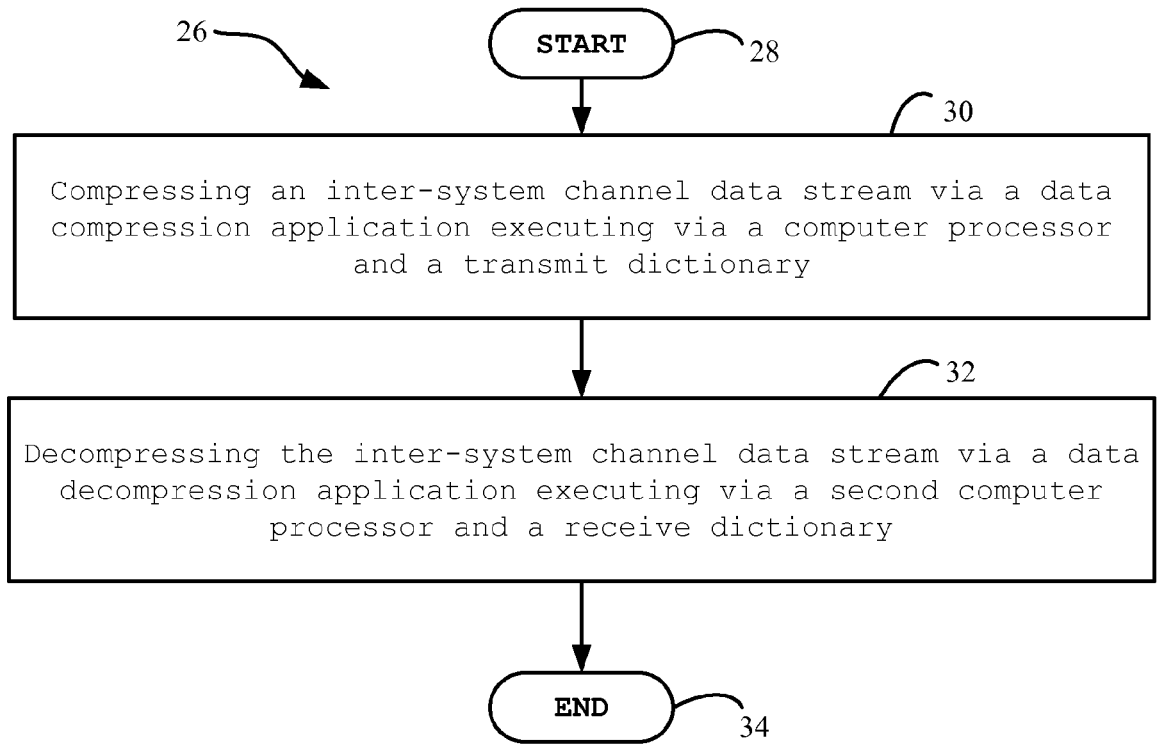
FIG. 2 is a flowchart illustrating method aspects according to the invention.

Another aspect of the invention is a method to compress an inter-system channel data stream, which is now described with reference to flowchart 26 of FIG. 2. The method begins at Block 28 and may include compressing an inter-system channel data stream via a data compression application executing via a computer processor and a transmit dictionary at Block 30. The method may also include decompressing the inter-system channel data stream via a data decompression application executing via a second computer processor and a receive dictionary at Block 32. The method ends at Block 34.

Figure 3:
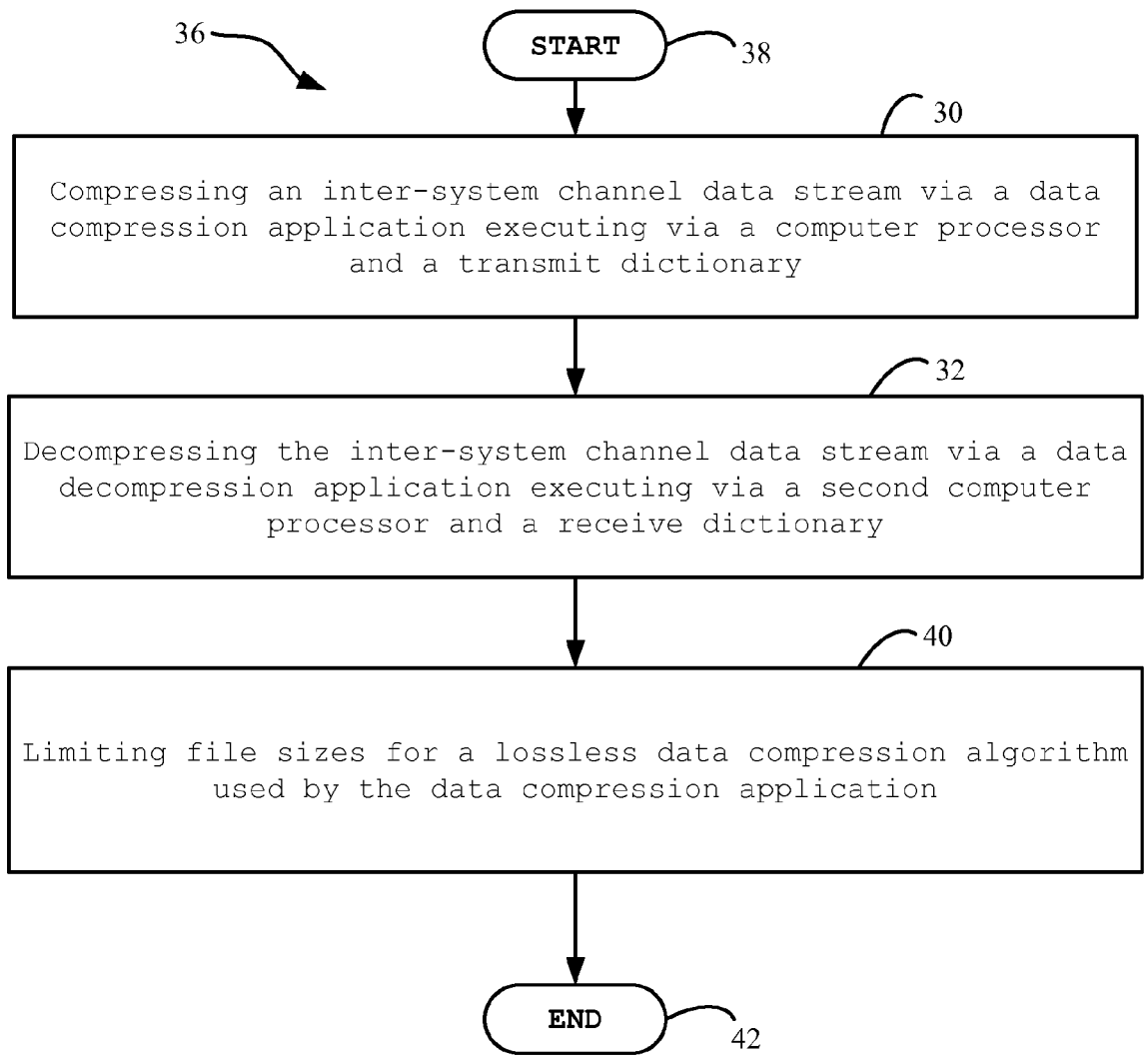
FIG. 3 is a flowchart illustrating method aspects according to the method of FIG. 2.

In another method embodiment, which is now described with reference to flowchart 36 of FIG. 3, the method begins at Block 38. The method may include the steps of FIG. 2 at Blocks 30 and 32. The method may additionally include limiting file sizes for a lossless data compression algorithm used by the data compression application at Block 40. The method ends at Block 42.

Figure 4:
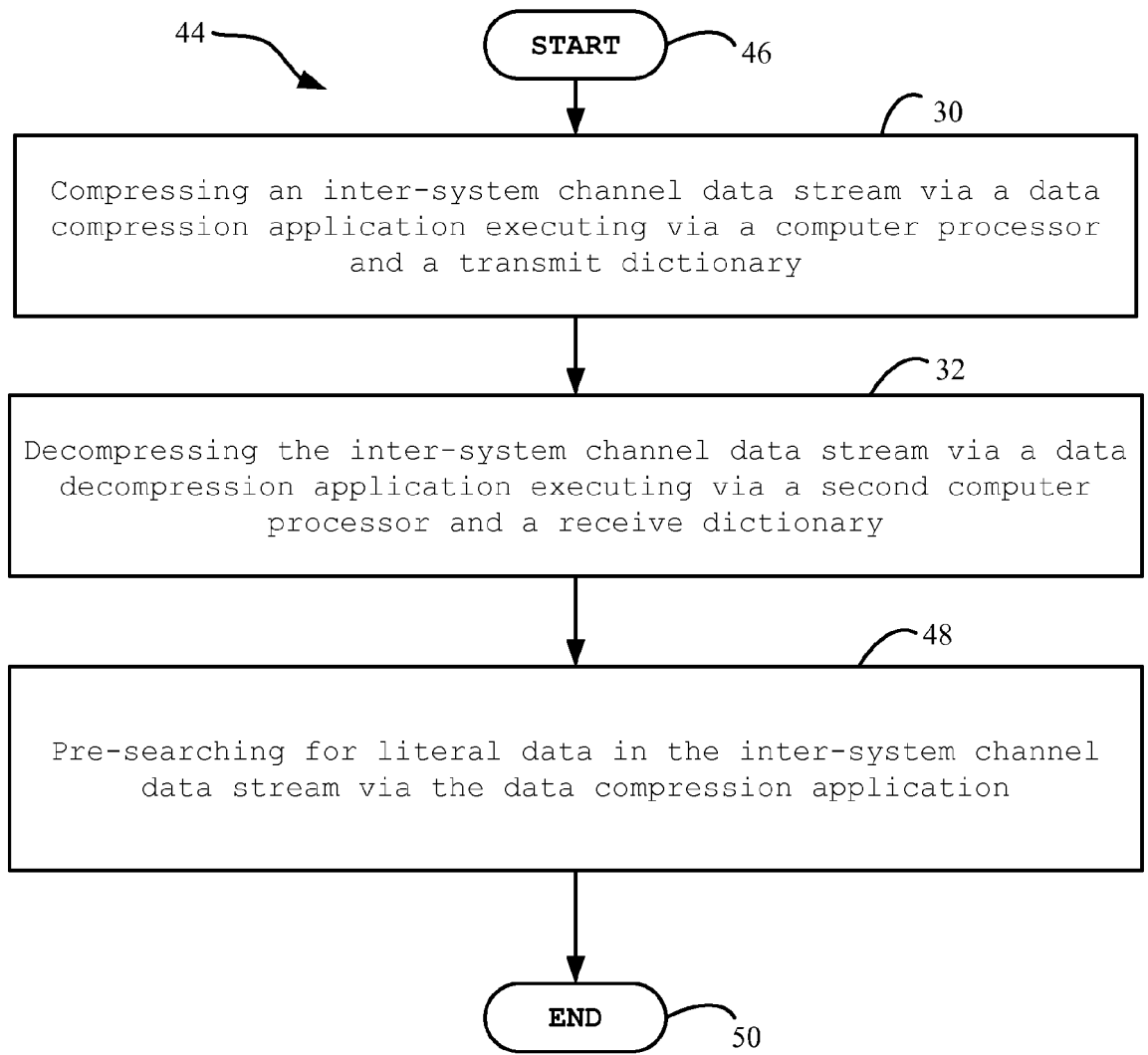
FIG. 4 is a flowchart illustrating method aspects according to the method of FIG. 2.

In another method embodiment, which is now described with reference to flowchart 44 of FIG. 4, the method begins at Block 46. The method may include the steps of FIG. 2 at Blocks 30 and 32. The method may additionally include pre-searching for literal data in the inter-system channel data stream via the data compression application at Block 48. The method ends at Block 50.

Figure 5:
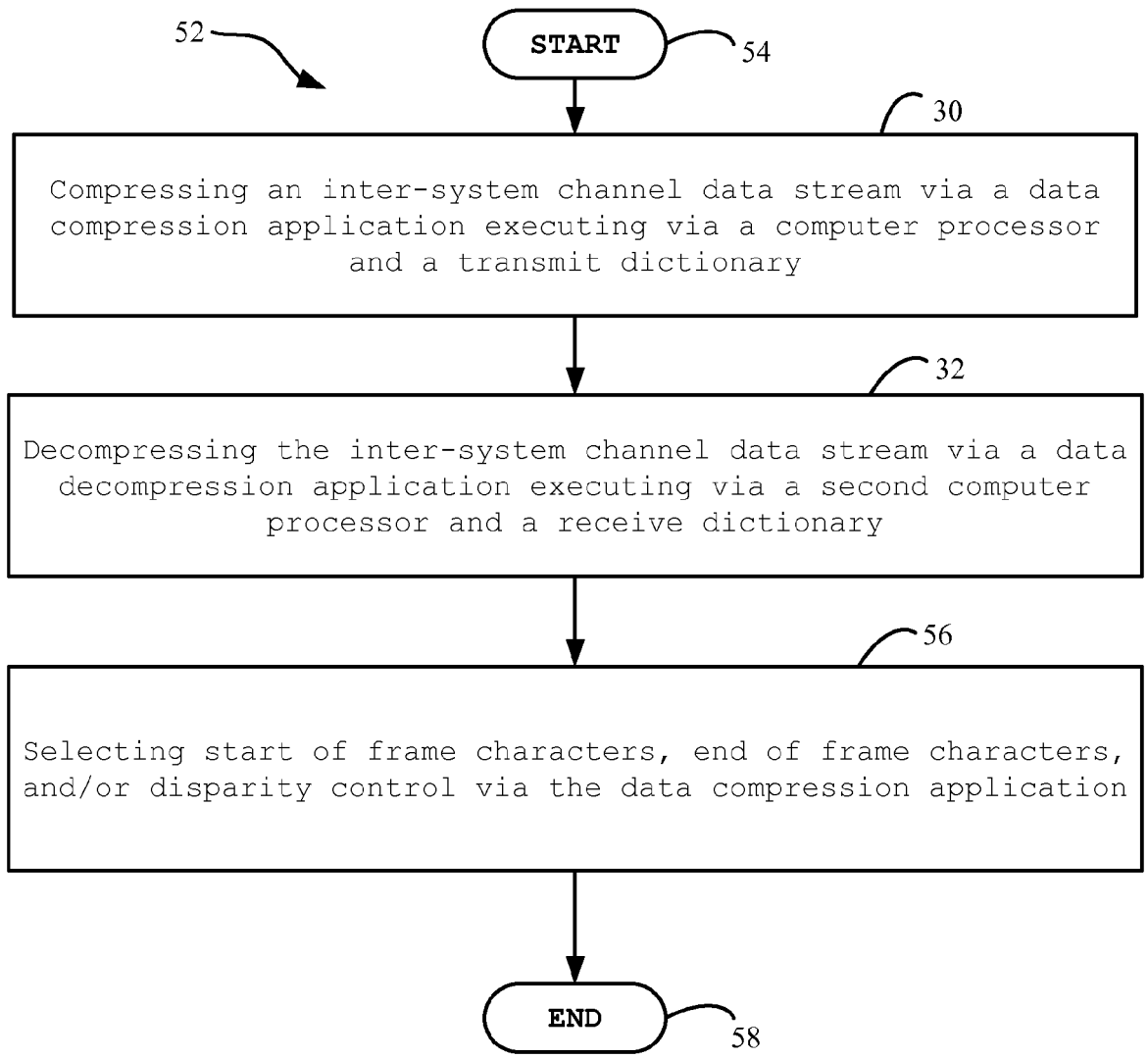
FIG. 5 is a flowchart illustrating method aspects according to the method of FIG. 2.

In another method embodiment, which is now described with reference to flowchart 52 of FIG. 5, the method begins at Block 54. The method may include the steps of FIG. 2 at Blocks 30 and 32. The method may additionally include selecting start of frame characters, end of frame characters, and/or disparity control via the data compression application at Block 56. The method ends at Block 58.

Figure 6:
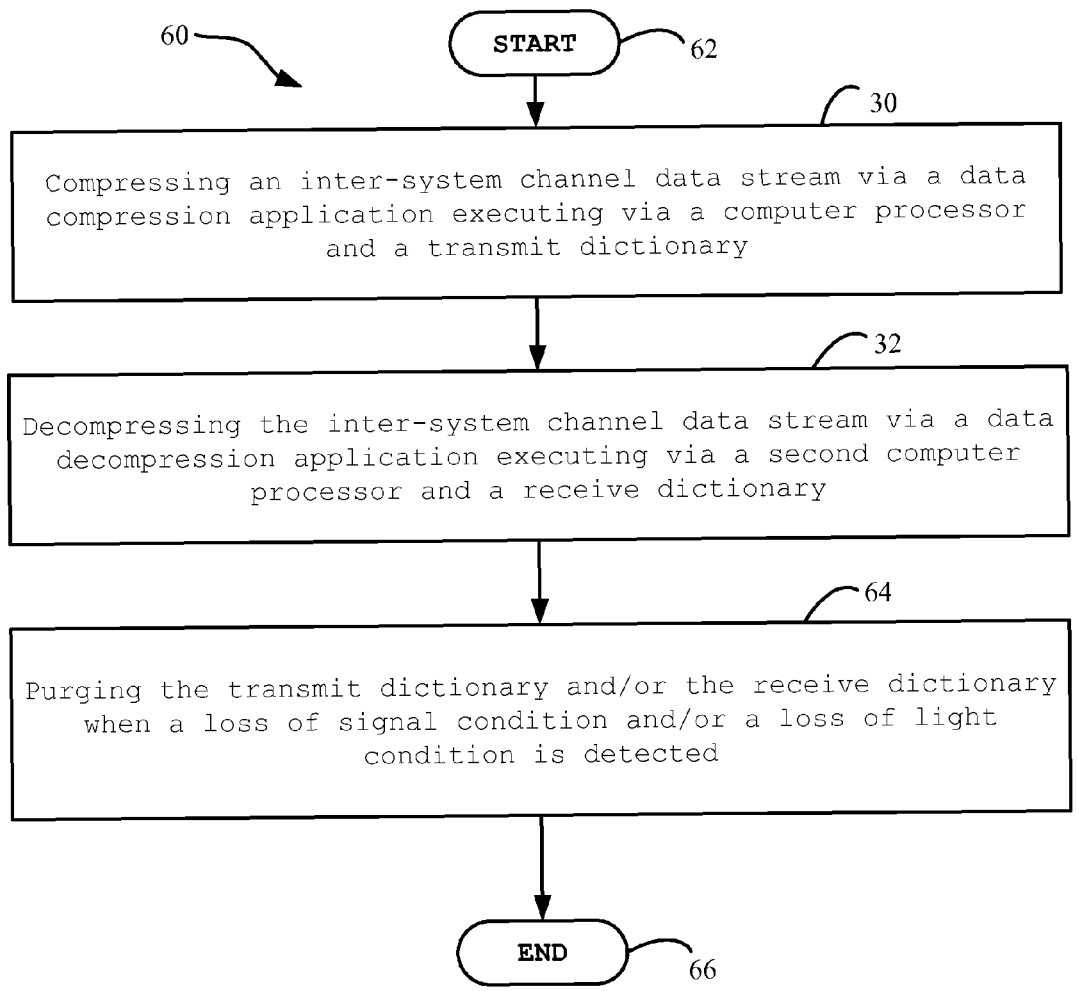
FIG. 6 is a flowchart illustrating method aspects according to the method of FIG. 2.

In another method embodiment, which is now described with reference to flowchart 60 of FIG. 6, the method begins at Block 62. The method may include the steps of FIG. 2 at Blocks 30 and 32. The method may additionally include purging the transmit dictionary and/or the receive dictionary when a loss of signal condition and/or a loss of light condition is detected at Block 64. The method ends at Block 66.

Figure 7:
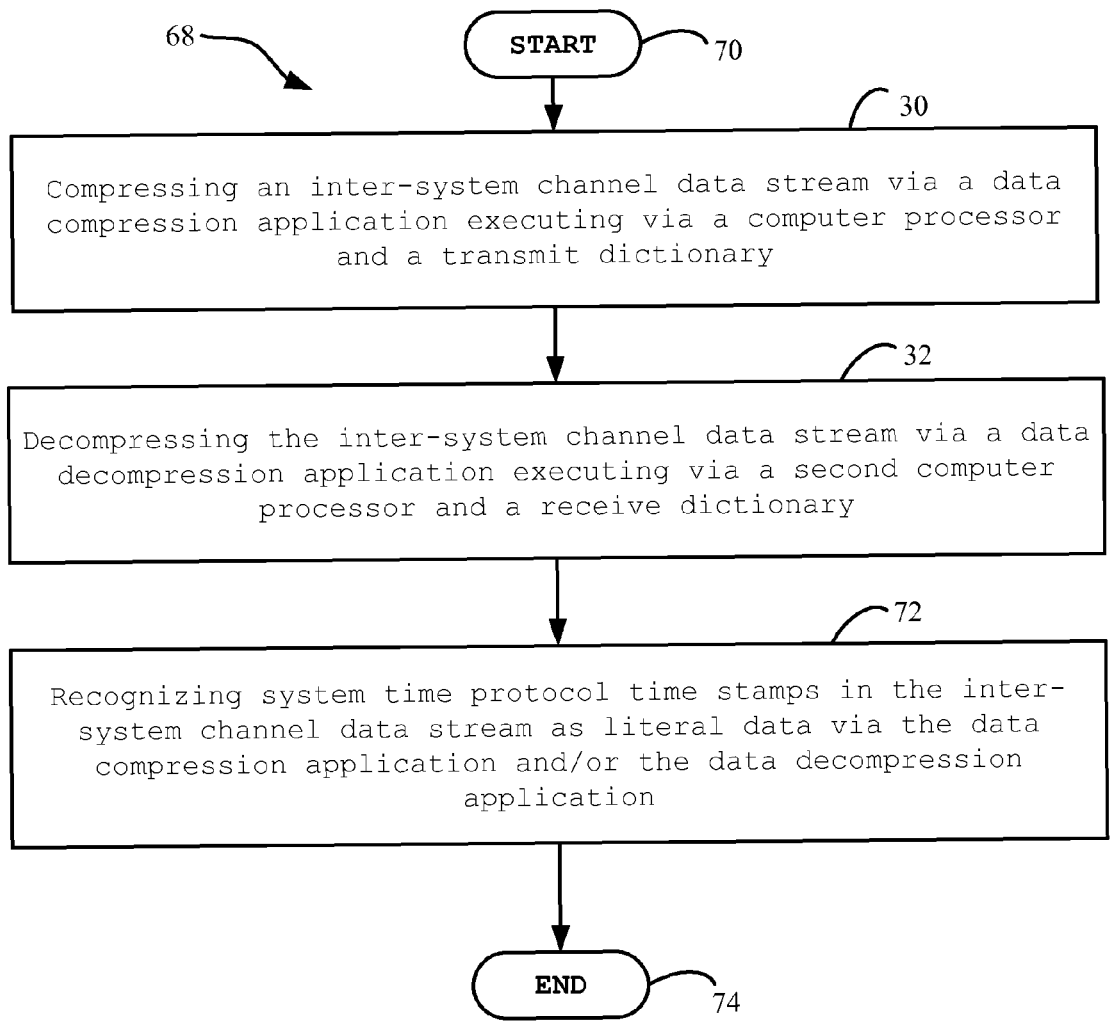
FIG. 7 is a flowchart illustrating method aspects according to the method of FIG. 2.

In another method embodiment, which is now described with reference to flowchart 68 of FIG. 7, the method begins at Block 70. The method may include the steps of FIG. 2 at Blocks 30 and 32. The method may additionally include recognizing system time protocol time stamps in the inter-system channel data stream as literal data via the data compression application and/or the data decompression application at Block 72. The method ends at Block 74.

Another aspect of the invention is computer readable program codes coupled to tangible media that may compress an inter-system channel data stream. The computer readable program codes may be configured to cause the program to compress an inter-system channel data stream via a data compression application 18 executing via a computer processor 12 and a transmit dictionary 20. The computer readable program codes may also decompress the inter-system channel data stream via a data decompression application 22 executing via a second computer processor 14 and a receive dictionary 24.

In view of the foregoing, the system 10, in one embodiment, may compress an inter-system channel data stream. As a result, the system 10 may reduce bandwidth utilization.

For example, data compression may become significant for transmission across wide area networks (WANs), where a service provider charges are based on the amount of bandwidth utilized. In long distance applications such as disaster recovery, it may be desirable to have faster data transfer rates at a lower cost.

Compression reduces the amount of data that must be transferred over a fixed bandwidth fiber optic link, thus reducing the overall cost. Compression also reduces the bandwidth required to transfer a fixed amount of data with a fixed quality of service, thus reducing the service tariff, and is expected to play a role in emerging server accelerators and network appliances. Recently, several of the International Business Machines' ("IBM") Geographically Dispersed Parallel Sysplex ("GDPS") qualified Wavelength Division Multiplexing ("WDM") equipment providers have demonstrated a need for compression of parallel sysplex protocols such as inter-system channel ("ISC"). This may be done partially to address the cost concerns noted above, and partially because vendors may be planning to implement compression on all their industry standard data links, such as Fibre Channel and Ethernet. As a result, development of a single application or adapter card for the WDM platforms which can compress all protocols, including ISC is desirable.

In one embodiment of system 10, the compression ratio is also a result of the amount of searching done to match the longest possible input data sequence. It is possible to trade off compression ratio for compression speed by changing the amount of searching performed. Since decompression simply reads the given length of bytes from the desired output location in its dictionary, it is a much faster operation then compression and does not require this tradeoff.

For example, there are several modifications to the standard LZS algorithm which are required to support ISC data. First, the size of the dictionary in system 10 is changed to optimize performance of the algorithm for ISC data. With knowledge of the amount of repeating patterns which occur in ISC traffic, we can not only choose an optimal size for the dictionary but also achieve the best compression ratio with the minimal search time.

In one embodiment, for purposes of implementing data compression, the ISC protocol requirements will be described. These requirements have not been made generally available previously, making it impossible to develop data compression systems for ISC links. These requirements are also unique to ISC protocols as compared with other industry standard protocols. The following details are required in order to design a data compression system for ISC data. Data transmission occurs on 32 bit boundaries (4 byte words). Transmission uses the 8B/10B code, resulting in 40 bit words on the line. Data words consist of four data characters. Idle words contain the K21.5 character followed by three D21.5 characters (K28.5, D21.5, D21.5, D21.5). Idle words have plus and minus disparity, and are eligible for compression. Null words contain the K28.5 character followed by two D21.5 characters and a D16.5 character (K28.5, D21.5, D21.5, D16.5). Null words have zero disparity, but two codes are used depending on the running disparity. Null words are eligible for compression. The Idle sequence repeats the Idle words. The K28.5 character alternates disparity. If this rule is followed, the entire Idle sequence is eligible for compression. There are four continuous sequences. These are used during link initialization and recovery to indicate specific end point states. They are transmitted as Data words alternating with the Idle word. The four Data words are: D00.2, D21.5, D21.5, D21.5; D24.2, D21.5, D21.5, D21.5; D15.2, D21.5, D21.5, D21.5; and D16.2, D21.5, DF21.5, D21.5. These words should be recognized by the dictionary and are eligible for compression. Frames do not have explicit delimiters. Frames consist of a group of Data words. Frames have anywhere from two (2) to 1027 Data words, which represent literal data. Frames are transmitted within idle sequences and not within Continuous sequences. Null words may be inserted anywhere in the stream of Idle and Data words (idle sequences, continuous sequences, and frames) and effectively slow down the information transfer rate on the link so that certain processing operations can complete properly. For WAN transmission purposes, null words are eligible for compression. Null words are sometimes transmitted with incorrect starting disparity; while most of the IBM receivers check for the correct null word, some other server implementations do check for the proper null word. Thus, the compression should keep track of both null word starting disparities in the dictionary in order to interoperate with all types of ISC channels; if the network is only to be used with IBM servers, then the disparity of the null word does not have to be tracked in the compression dictionary. The transmitters are turned off to indicate certain error conditions. This condition should be fed transparently through the compressor. Older ISC links operating at one gigabit per second use open fiber control ("OFC"); compression on these links should not be initiated until the OFC interlock completes and the link is initialized (this can be determined either through a link status line provided by the optics hardware or through higher levels of the software).

We can estimate the improvement on an ISC channel, assuming a 100 km link (1 ms latency). ISC can potentially support 2 Kbytes per message best case in unidirectional operation. Buffer size limitations require the server to idle after 7 messages have been sent. Thus we can transfer a maximum of 14 Kbytes in 1 ms, or 14 Mbytes effective data rate (vs. the ISC line rate of 212 Mbyte/s), and the remaining link time is mostly consumed sending idle characters, and a few null characters.

Assuming we can achieve 100% link busy (all read/write operations) and that we compress the resulting large number of idles in the data stream by sending only a start/stop command at the beginning and end of each idle stream, we should be able to achieve about 93% compression. Even if we limit the implementation to a 1 Kbyte buffer and only send one start/stop character every 100 idles or so, we can still realize a substantial reduction in the required data transfer.

A further change may be required to allow for proper error recovery of a compressed ISC link. The dictionary is maintained at both ends of the link to facilitate compression. However, in the event of a link failure such as loss of light or loss of sync, the ISC channel will purge the dictionary buffers on both ends of the link in order to prevent data integrity issues.

In another example, the system 10 saves a copy of incoming data to a dictionary file. The system 10 searches new incoming data for pattern match. The system 10 sets time allowed for this search.

The system 10 anticipates when repetitive blocks occur. The system 10 replaces the longest possible data block with token (go to a specified position in dictionary, transmit a specified number of bytes).

The system 10 transmits compressed data and token. The system 10 saves a copy of receiver inbound data to dictionary file. Received data is decompressed by using tokens to extract relevant data from a substantially identical dictionary file.

The system 10 saves a copy of incoming data to the dictionary file. The system 10 presets the file size to optimize for the data stream. The system 10 searches new incoming data for pattern match. The system 10 sets time allowed for this search and/or anticipates when repetitive blocks occur.

The system 10 searches for literal data (idles, CS)—nulls are rare. The system 10 selects a start/end character and/or disparity control. The system 10 replaces the longest possible data block with a token (go to xx position in dictionary, transmit xx bytes).

The system 10 transmits the compressed data and token. The system 10 saves a copy of receiver inbound data to dictionary file.

Received data is decompressed the system 10 by using tokens to extract relevant data from the substantially identical dictionary file. The system 10 maintains a pointer file and/or literal data and position of literal data relative to original data stream.

If the system 10 detects LOL/LOS, there is a purge of both transmit dictionary 20 and receive dictionary 24. The system 10 generates a new dictionary file when the error condition clears.

In one embodiment, the system 10 includes additional requirements. For example, ISC channels require a purge of the transmit dictionary 20 and receive dictionary 24 if LOL or LOS is detected. Or, for instance, the system 10 requires that system time protocol timestamps are recognized by the compression algorithm as literal data.

In one embodiment, the system 10 uses 2.4 K transmit buffer, and achieves at least 6:1 compression ratio. However, alternate embodiments with compression speed tradeoffs are possible.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system comprising:
   a data compression application executing via a computer processor;
   a transmit dictionary used by said data compression application to compress an inter-system channel data stream, wherein inter-system channel is a parallel sysplex protocol;
   a data decompression application executing via a second computer processor to decompress the inter-system channel data stream; and
   a receive dictionary used by said data decompression application to decompress the inter-system channel data stream, wherein at least one of said transmit dictionary and said receive dictionary are purged when at least one of a loss of signal condition and a loss of light condition is detected.

2. The system of claim 1 wherein said data compression application comprises a lossless data compression algorithm.

3. The system of claim 2 wherein the lossless data compression algorithm comprises a Lempel-Ziv Stac algorithm.

4. The system of claim 2 wherein said data compression application limits file sizes for the lossless data compression algorithm.

5. The system of claim 1 wherein said data compression application pre-searches for literal data in the inter-system channel data stream.

6. The system of claim 5 wherein the literal data includes at least one of inter-system channel idles and inter-system channel continuous sequences.

7. The system of claim 1 wherein said data compression application selects at least one of start of frame characters, end of frame characters, and disparity control.

8. The system of claim 1 wherein at least one of said transmit dictionary and said receive dictionary are restarted when at least one of the loss of signal condition and the loss of light condition is cleared.

9. The system of claim 1 wherein at least one of said data compression application and said data decompression application recognize system time protocol time stamps in the inter-system channel data stream as literal data.

10. A method comprising:
    compressing an inter-system channel data stream via a data compression application executing via a computer processor and a transmit dictionary, wherein inter-system channel is a parallel sysplex protocol;
    decompressing the inter-system channel data stream via a data decompression application executing via a second computer processor and a receive dictionary; and
    purging at least one of the transmit dictionary and the receive dictionary when at least one of a loss of signal condition and a loss of light condition is detected.

11. The method of claim 10 further comprising limiting file sizes for a lossless data compression algorithm used by the data compression application.

12. The method of claim 10 further comprising pre-searching for literal data in the inter-system channel data stream via the data compression application.

13. The method of claim 10 further comprising selecting at least one of start of frame characters, end of frame characters, and disparity control via the data compression application.

14. The method of claim 10 further comprising recognizing system time protocol time stamps in the inter-system channel data stream as literal data via at least one of the data compression application and the data decompression application.

15. A non-transitory computer program product to compress an inter-system channel data stream, said computer program product comprising:
    a computer readable storage medium:
    first program instructions to compress an inter-system channel data stream via a data compression application executing via a computer processor and a transmit dictionary, wherein inter-system channel is a parallel sysplex protocol;
    second program instructions to decompress the inter-system channel data stream via a data decompression application executing via a second computer processor and a receive dictionary;
    third program instructions to purge at least one of the transmit dictionary and the receive dictionary when at least one of a loss of signal condition and a loss of light condition is detected; and
    wherein said first, second, and third program instructions are stored on said computer readable storage medium.

16. The non-transitory program product of claim 15 further comprising another program instruction to: limit file sizes for a lossless data compression algorithm used by the data compression application.

17. The non-transitory program product of claim 15 further comprising another program instruction to: pre-search for literal data in the inter-system channel data stream via the data compression application.

18. The non-transitory program product of claim 15 further comprising another program instruction to: select at least one of start of frame characters, end of frame characters, and disparity control via the data compression application.

* * * * *